United States Patent
Chen (10) Patent No.: US 6,724,207 B1
(45) Date of Patent: Apr. 20, 2004

(54) STRUCTURE COMPOSITE-TYPE TEST FIXTURE

(76) Inventor: Tung-Han Chen, No. 313, Sec. 1, Wen-Jong Rd., LW JWU Shiang, Taoyuan (TW)

( * ) Notice: Subject to any disclaimer, the term of this patent is extended or adjusted under 35 U.S.C. 154(b) by 0 days.

(21) Appl. No.: 10/384,610

(22) Filed: Mar. 11, 2003

(51) Int. Cl.$^7$ .............................................. G01R 31/02
(52) U.S. Cl. .................. 324/755; 324/158.1; 324/761
(58) Field of Search .................. 324/765, 755, 324/754, 758, 761, 158.1; 439/482, 912

(56) References Cited

U.S. PATENT DOCUMENTS

| | | | | |
|---|---|---|---|---|
| 5,396,186 A | * | 3/1995 | Scheutzow | 324/754 |
| 5,883,520 A | * | 3/1999 | Delfosse et al. | 324/761 |
| 5,945,838 A | * | 8/1999 | Gallagher et al. | 324/761 |
| 6,025,729 A | * | 2/2000 | Van Loan et al. | 324/755 |

* cited by examiner

*Primary Examiner*—Evan Pert
*Assistant Examiner*—Jimmy Nguyen
(74) *Attorney, Agent, or Firm*—Rosenberg, Klein & Lee (57) ABSTRACT

An improved structure composite-type test fixture consisting of a stack planar postured flush against the upper surface of a probe board which is situated on the upper extent of a base such that holes predisposed in the face of the probe board provides for the entry of probe barrels. Comprised of a top board, a thickness board, and a pliant plastic board, the stack planar has through-holes predisposed in a certain alignment that provides for the insertion of probes to the various connection points of a circuit board being tested. The tips of the probes are in a range of different diameters and size specifications, the top extremities protrude from the upper surface of the stack planar, and the distal extremities consist of a single specification insert section that fit into the probe barrels. Each probe barrel has an internally disposed spring. A wire is connected to the bottom end of the spring and a copper pin terminates the remaining free end of the wire, enabling the insertion of the copper pin into the flat cable of a circuit tester. As such, the fixture structure of the invention herein is simple to manufacturer, of significantly reduced production cost, and capable of enhanced testing accuracy.

4 Claims, 12 Drawing Sheets

STRUCTURE COMPOSITE-TYPE TEST FIXTURE

BACKGROUND OF THE INVENTION

1) Field of the Invention

The invention herein relates to circuit board diagnostic and examination utilities, specifically an improved structure composite-type test fixture.

2) Description of the Prior Art

After various electronic components are soldered to a circuit board, it must undergo testing to determine if there are shorts among the traces and junctions. The industry now utilizes a circuit board testing method (see FIG. 1) consisting of a plurality of probes 2 disposed in the upper surface of a fixture 1, with the said plurality of probes 2 situated such that they match the positions of connection points along the bottom surface of a circuit board unit under test 3. The fixture 1 has a rectangular base 11 and latched connectors 12 are installed along the perimeter of the said base 11; each latched connector 12 must be in electrical continuity with the probes 2 so that the latched connectors 12 can be utilized for interfacing the flat cable (not shown in the drawings) of a circuit board tester.

Figure 1:
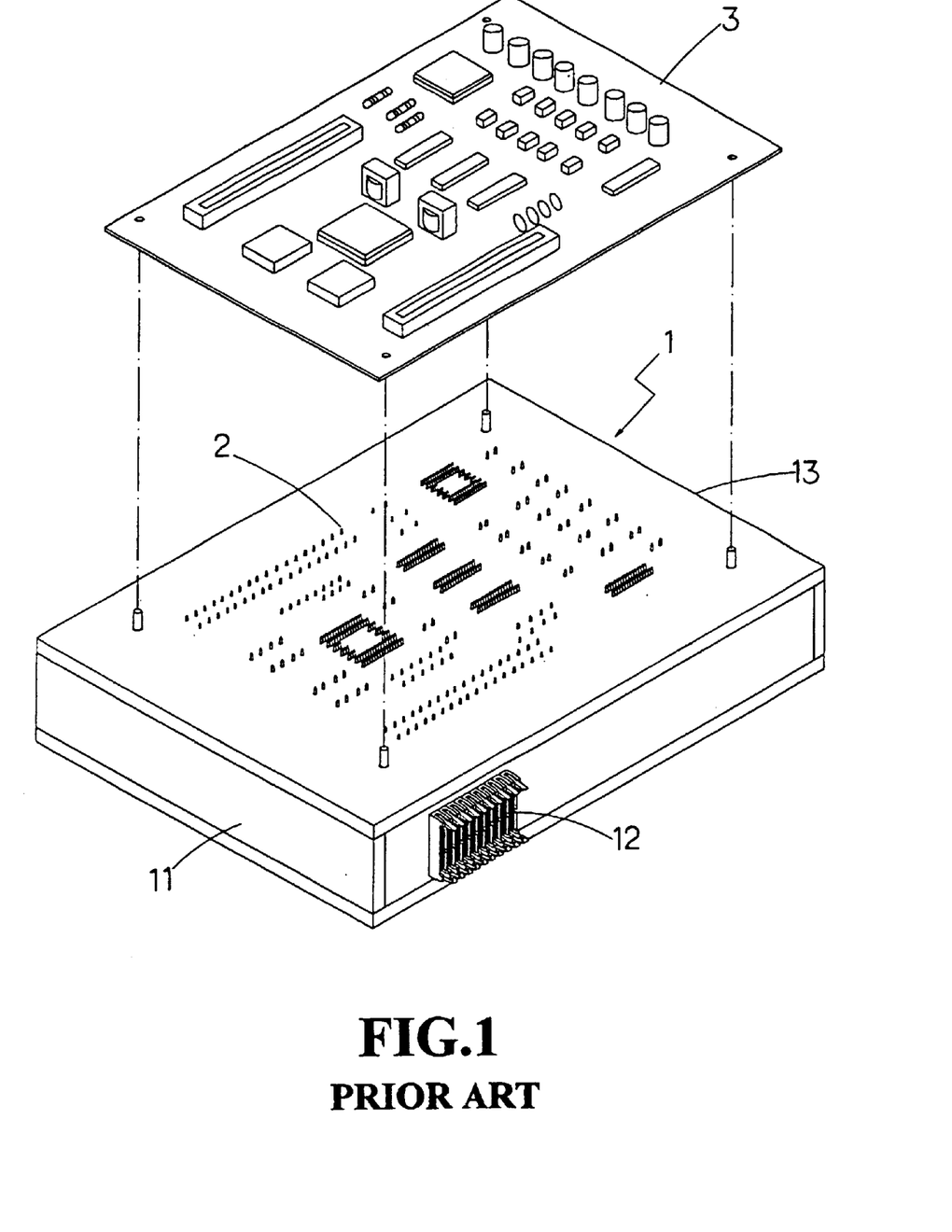
FIG. 1 is an isometric drawing of a conventional fixture utilized for testing circuit boards.

When testing a circuit board, the flat cable of the circuit board tester is plugged into a latched connector(s) 12 and the circuit board unit under test 3 is aligned with the probes 2 on the fixture 1. After the probes 2 contact the component leads along the bottom surface of the circuit board unit under test 3, the circuit board tester indicates whether there are trace and/or junction short circuits the circuit board unit under test 3.

Figure 2:
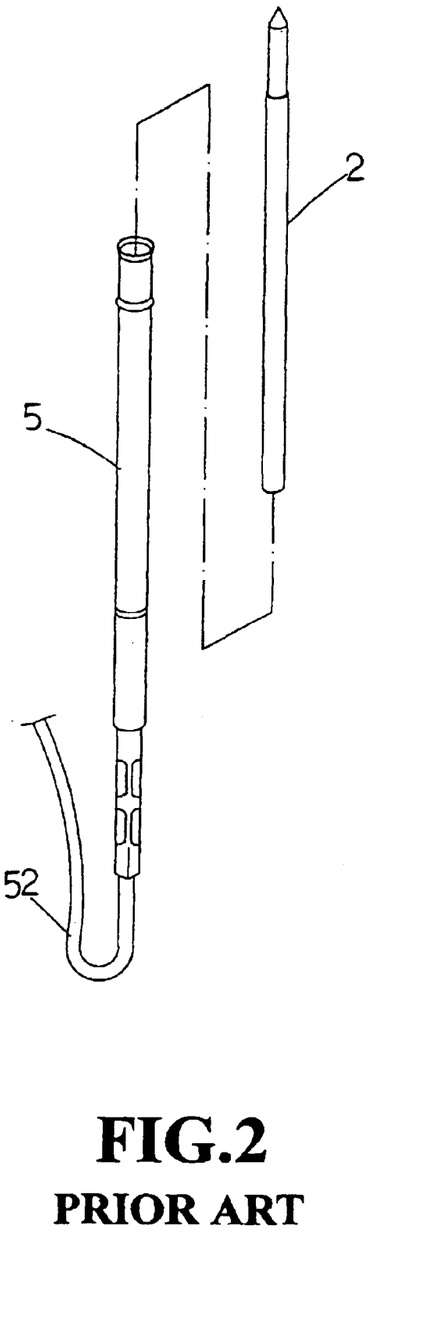
FIG. 2 is an exploded drawing of a conventional probe and probe barrel.
Figure 3:
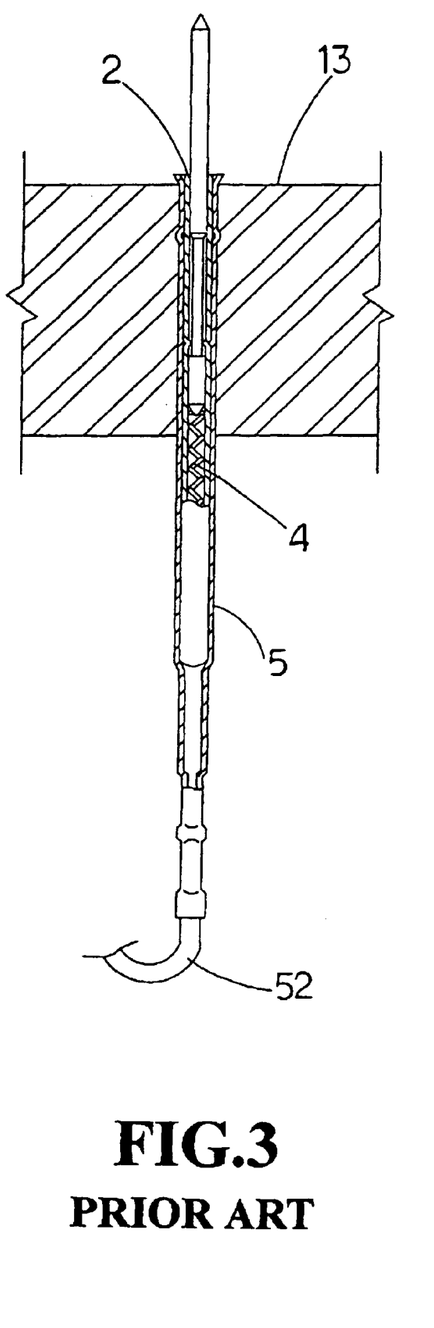
FIG. 3 is a cross-sectional drawing of a conventional probe and probe barrel in the installed state.
Figure 4:
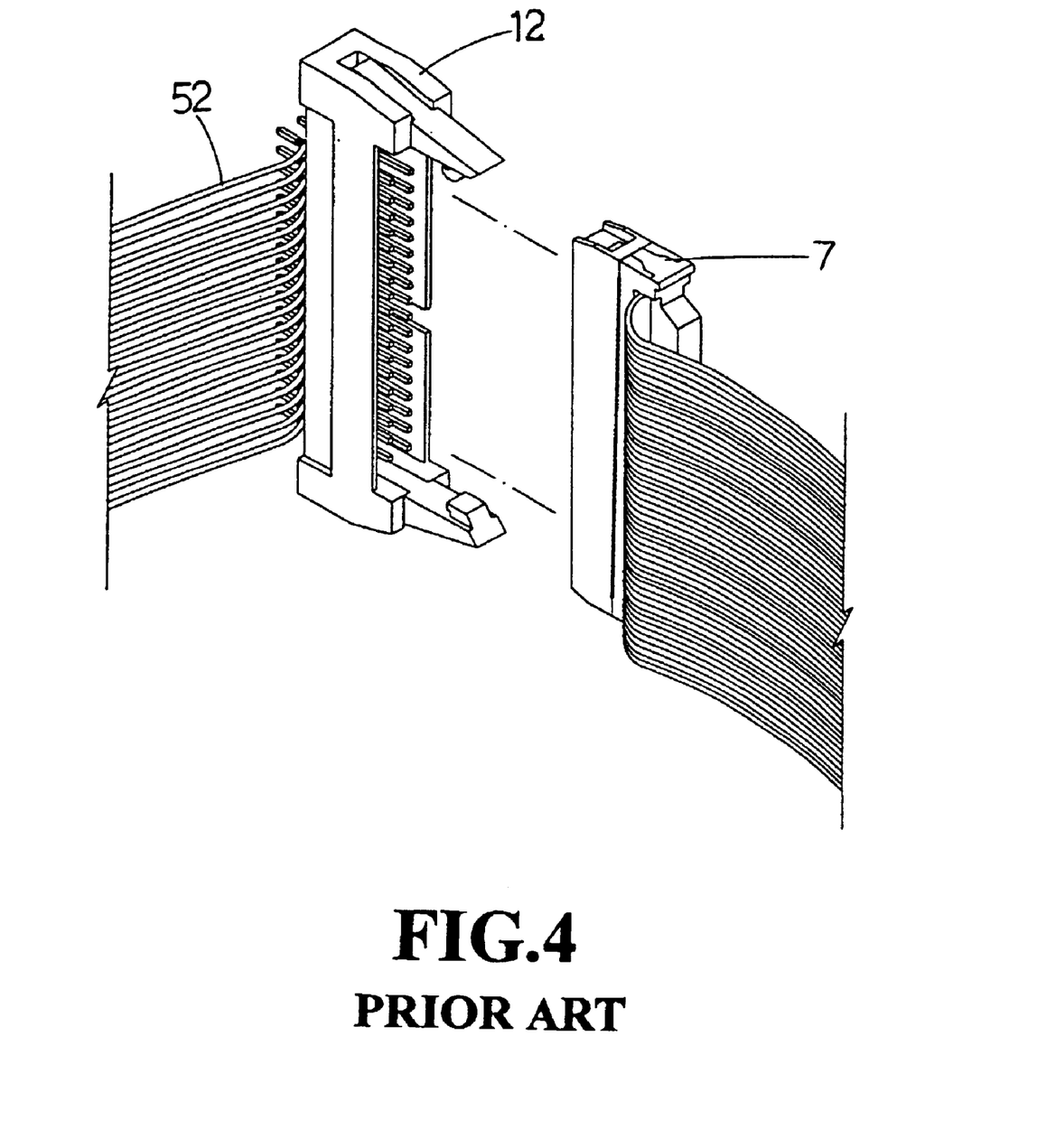
FIG. 4 is an isometric drawing of the cable between the latched connector of the conventional fixture and the probe barrel.

The said fixture 1 that provides for circuit board testing is not a mass produced item, but a dedicated utility for a particular type of circuit. The construction process of the said fixture consists of first drilling holes in the probe board 13 that are aligned with the traces and connection points of the circuit board under test 3 and then later inserting probe barrels 5 that each ensleeve a probe 2 (as shown in FIG. 2 and FIG. 3) in every hole; of course, before the said probe barrels 5 are inserted into the holes, the wires 52 at their trailing ends must be coupled to the latched connector 12 (as shown in FIG. 4) and finally the probes 2 are admitted into the probe barrels 5.

As such, a circuit board testing fixture 1 set requires the manual coupling of the trailing end wires 52 of each probe barrel 5 to the latched connector 12, with each complete fixture 1 necessitating the securing of 200 to 300 or more wires such that connection in mass volume consumes extremely long periods of labor which results in rather high production costs. Furthermore, if the connection of the wire 52 is not executed carefully, contact between adjacent wires may cause short circuits that affect test results.

Furthermore, the internal structure of the said probes 2 also consists of a spring 4 that compresses and decompresses such that when the circuit board unit under test 3 is held down during examination, the probes 2 contact the connection points on the bottom surface of the circuit board unit under test 3. However, the said probe 2 itself is very small and, therefore, the spring 4 at the interior section not only involves extremely high technology, but is also troublesome and difficult to fabricate, resulting in steeper overall probe 2 and fixture 1 production costs. Naturally, since the said spring 4 is also diminutive, service life is shorter and, furthermore, its high susceptibility to wear directly influences test results. Thus, to ensure test result accuracy, probes 2 utilized by the fixture 1 must be replaced on a regular basis, a task that is overly troublesome, inconvenient, and uneconomical.

SUMMARY OF THE INVENTION

The primary objective of the invention herein is to provide an improved structure composite-type test fixture that improves upon the said shortcomings and which is simple to fabricate to thereby lower production costs and effectively raise testing accuracy.

DETAILED DESCRIPTION OF THE INVENTION

Figure 5:
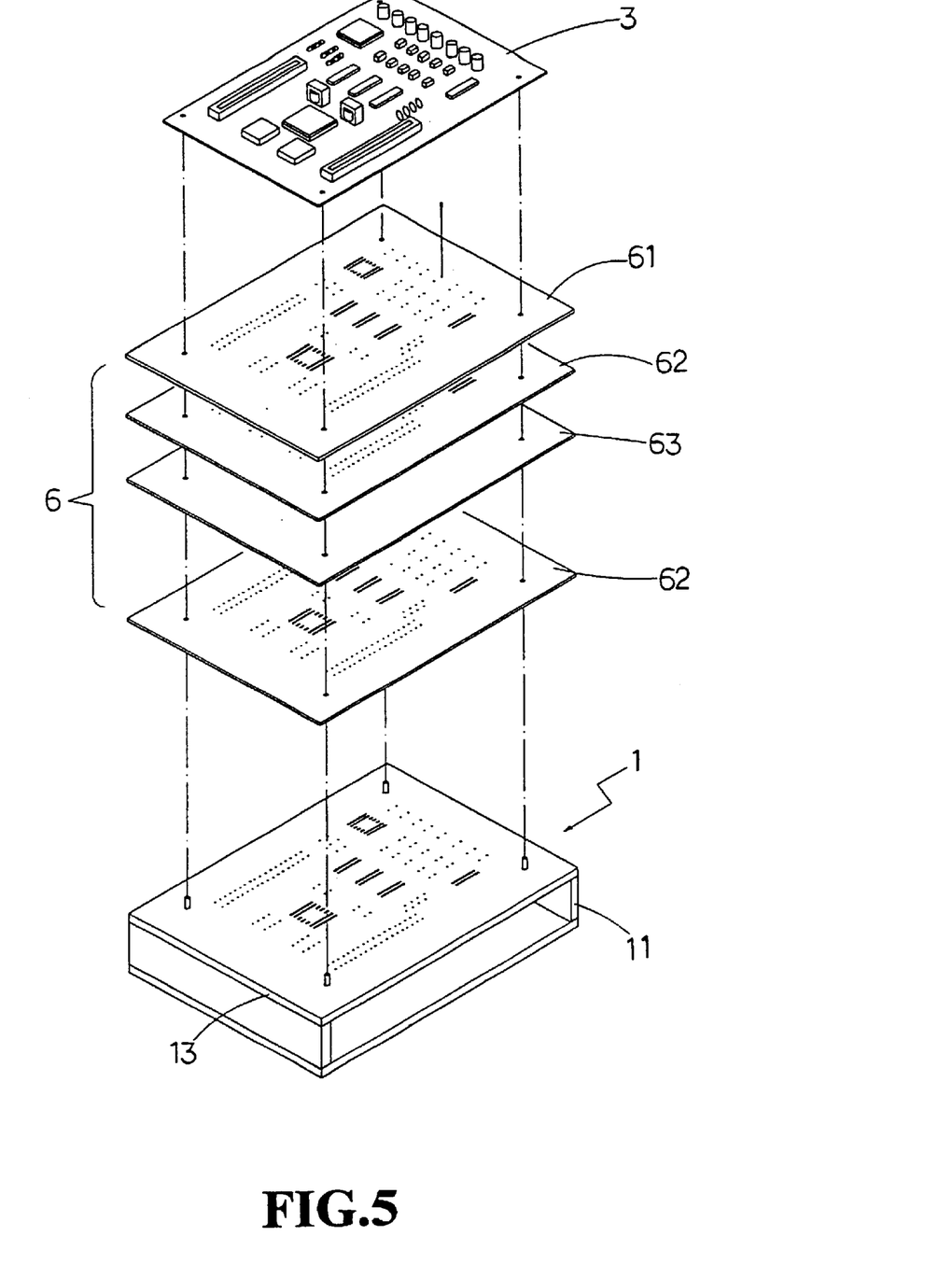
FIG. 5 is an exploded drawing of the composite-type test fixture structure of the invention herein.
Figure 6:
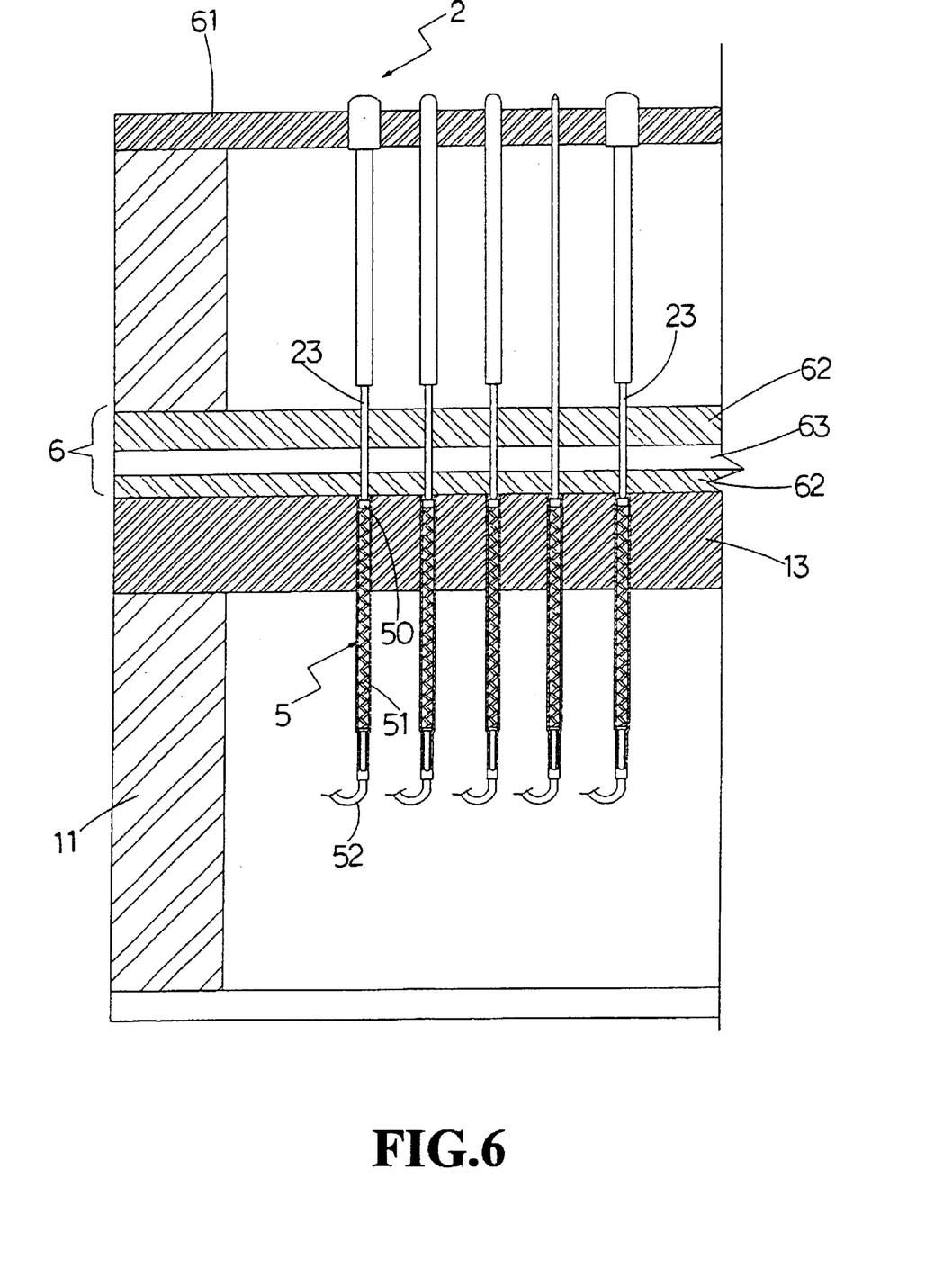
FIG. 6 is a cross-sectional drawing of the invention herein during implementation.

Referring to FIG. 5 and FIG. 6, the improved structure composite-type test fixture of the invention herein consists of a probe board 13 situated on the top surface of a fixture base 11 and having a plurality of holes drilled in its upper surface that are aligned at the bottom surface with the connection points of a circuit board unit under test 3, a stack planar 6 postured flush against the upper surface of the said probe board 13, and a plurality of through-holes drilled in the said stack planar 6 that are aligned with the probe board 13 holes. Wherein, the holes of the said probe board 13 provide for the entry of the probe barrels 5 (as shown in FIG. 6), the through-holes of the said stack planar 6 provide for the insertion of the probes 2 and, furthermore, the top extremities of the probes 2 protrude from the upper surface of the stack planar 6.

Figure 7:
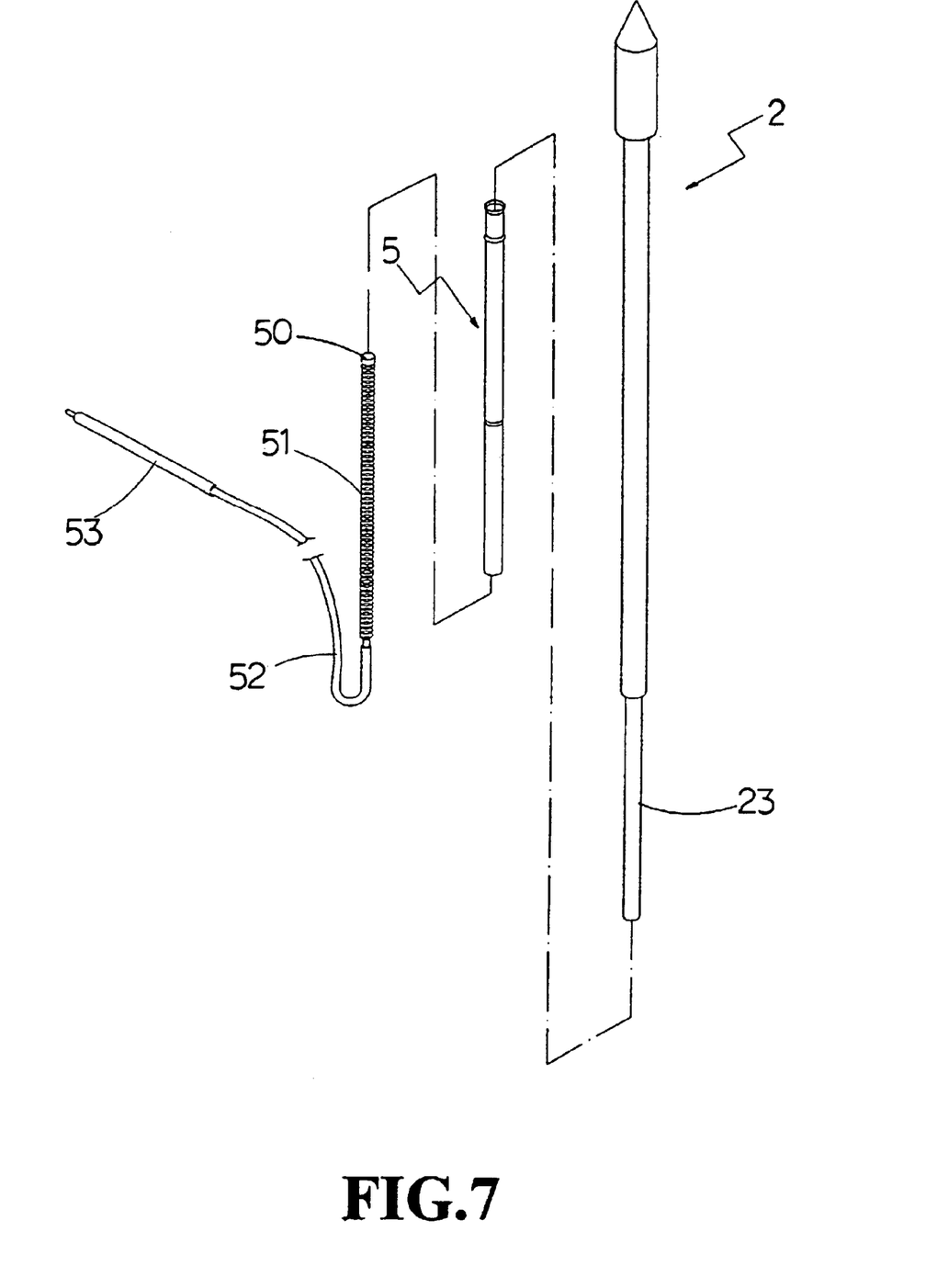
FIG. 7 is an exploded drawing of the probe, the probe barrel, the upper block, the spring, the wire, and the copper pin of the invention herein.

Referring to FIG. 7, each said probe barrel 5 follows conventional inner diameter specifications, but also includes an internally disposed spring 51; the said spring 51 has an upper block 50 at the leading end and a wire 52 connected to the trailing end; after the said probe barrel 5 is sleeved over the exterior of the spring 51, the trailing end is clipped to it. Furthermore, a copper pin 53 is disposed on the opposite end of the wire 52 connected to the trailing end of the spring 51. Each said probe 2 is a needle-like object having tips in a range of different diameter, size specifications, and shapes (as shown in FIG. 6) and distal extremities consisting of a single specification insert section 23, with the insert section 23 fitted into the probe barrel 5 and situated directly against the said upper block 50.

The said stack planar 6 consists of a top board 61 (as shown in FIG. 5 and FIG. 6) at its uppermost surface, with the through-holes in the said top board 61 disposed at the same diameter and dimensions as the tip extremities of the probes 2. Two thickness boards 62 are placed along the bottom portion of the said stack planar 6, the through-holes of the said thickness boards 62 disposed at the same specification as the insert sections 23 constituting the distal extremities of the probes 2, and one pliant plastic board 63 having no drilled holes is sandwiched between the two thickness boards 62. The said pliant plastic board 63 is installed to immobilize the insert sections 23 at the distal extremities of the probes 2 and, furthermore, no slippage occurs when pressure is applied during testing to thereby prevent the dislodging of the probes 2.

Figure 8:
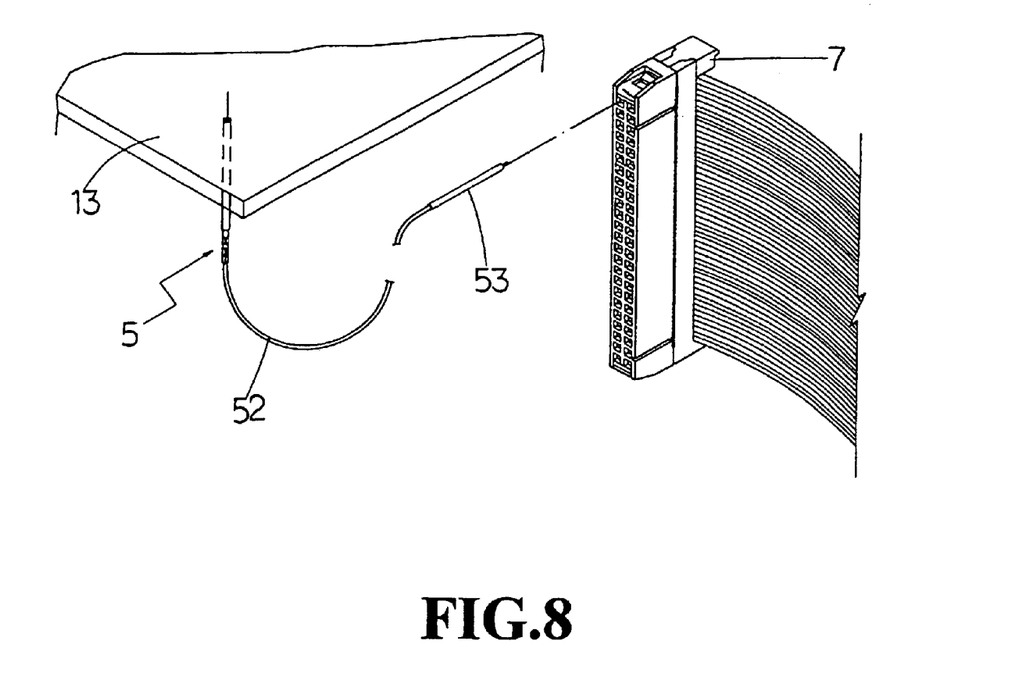
FIG. 8 is an isometric drawing of the probe barrel connected to the flat cable.

Utilizing the said original design of the invention herein, the individual coupling of the wires 52 is not required during the set up of the fixture and neither is the installation of latched connectors. Referring to FIG. 8, by designing the copper pin 53 such that it terminates the trailing end of the wire 52 from the probe barrel 5 and thereby enables direct insertion into the flat cable 7 of the circuit tester results in a significant reduction of fixture fabrication time as well as much lower fixture production costs.

The unique structure of the present invention affords the following advantages:
(1) The probe 2 arrangement is class variable and the requisite production technology is straightforward such that production cost is sufficiently low to allow savings in probe 2 manufacturing expenditures.
(2) The probe barrel 5 has an internally disposed spring 51, the installation of which involves a simple operation that similarly results in lower production cost and, furthermore, since the diameter of the spring 51 is larger than that of the conventional probe 2 for the purpose of extending its service life, the overall usable service life of the spring 51 is prolonged to save on probe barrel 5 replacement costs.
(3) As the trailing ends of the probe barrel 5 wires 52 are designed with an integrated copper pin 53, they can be directly inserted into the flat cable 7 of a circuit tester, precluding the need to connected each wire 52 individually as is the case in the conventional arrangement, thereby simplifying connection procedures and saving installation time to similarly reduce fixture set up costs.

Figure 9:
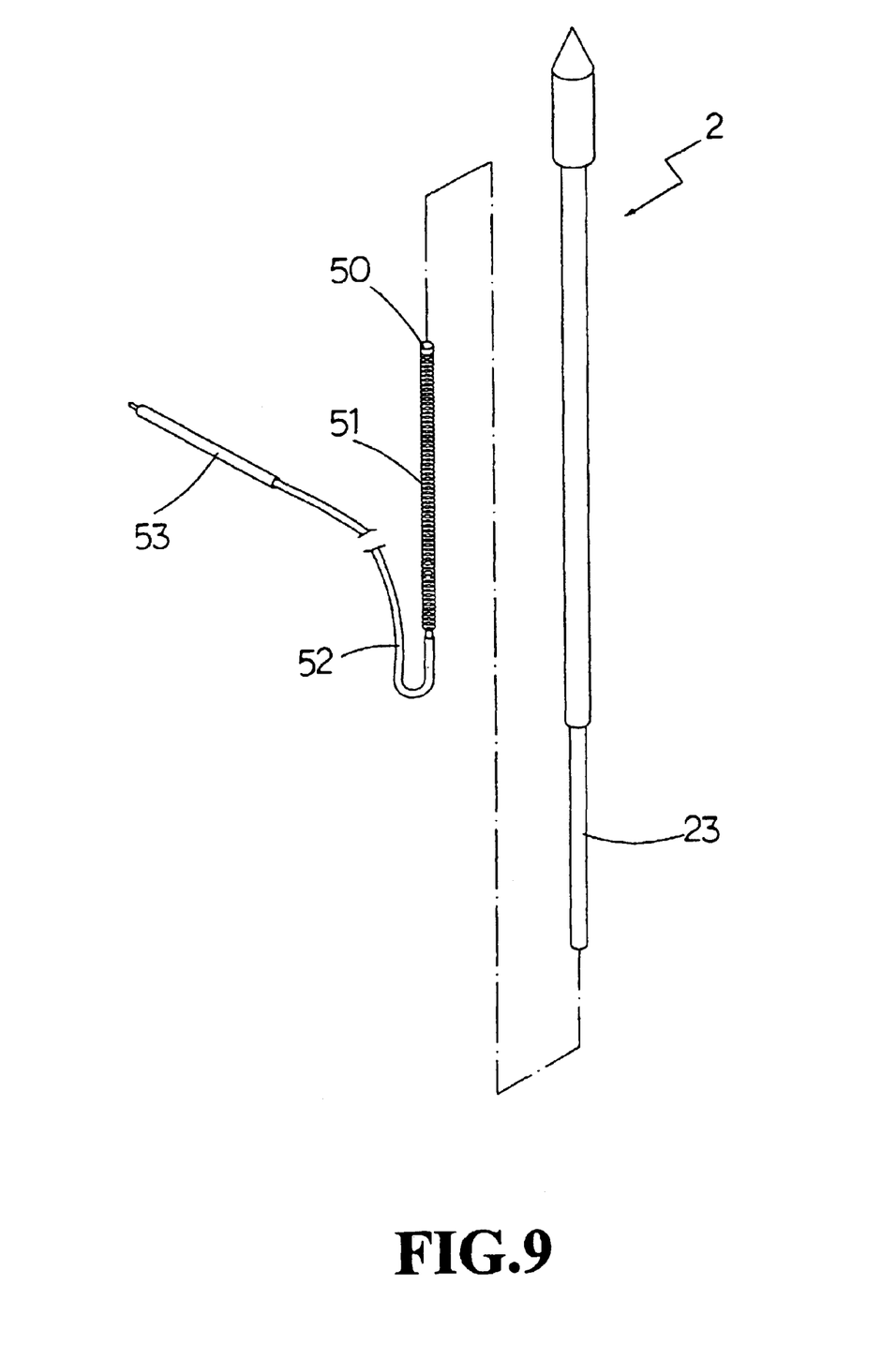
FIG. 9 is an exploded drawing of another configuration of the probe, the upper block, the spring, the wire, and the copper pin of the invention herein.
Figure 10:
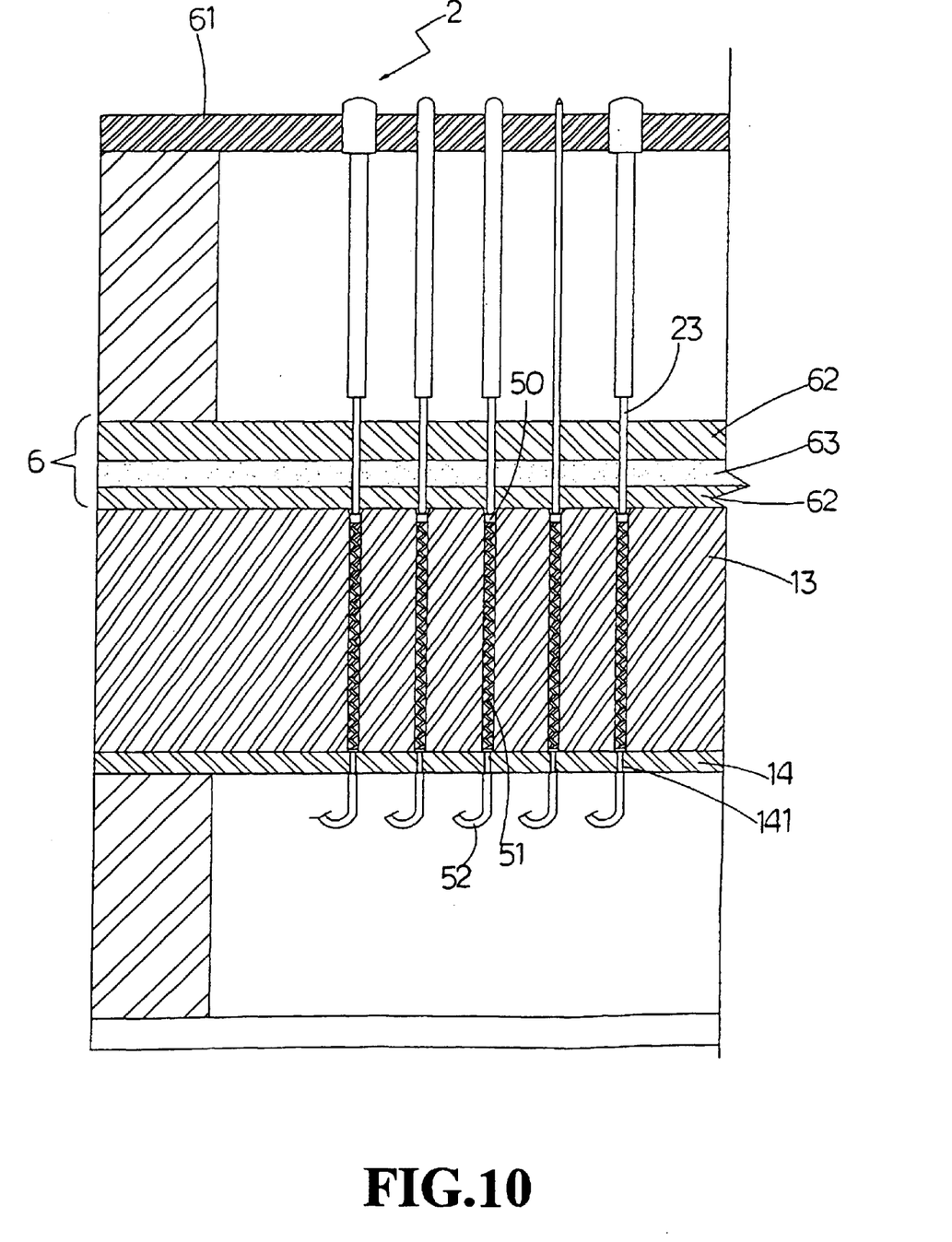
FIG. 10 is a cross-sectional drawing of the implementation in FIG. 9.

Although the most preferred embodiment of the invention herein has been disclosed above, it shall not be construed as a limitation applicable to the scope of the present invention but interpreted in terms of the protected spirit and claims of the invention herein in the event of modification and embellishment inspired there from; referring to FIG. 9 and FIG. 10, the probe barrel 5 of the invention herein can be omitted, and the trailing end of the spring 51 directly connected to the leading end of the wire 52 such that the leading ends of the wires 52 connected to the springs 51 are contained in the holes of the said probe board 13 to effectively accomplish the equivalent function. To achieve the said objective, the said probe plate 13 is additionally equipped immediately below with a bottom board 14 having minute through-holes 141 drilled in positional correspondence to the holes in the probe board 13 and sized to accommodate the inserted leading ends of the wires 52; as such, the trailing ends of the springs 51 contained in the holes of the probe board 14 are firmly maintained in position.

Figure 11:
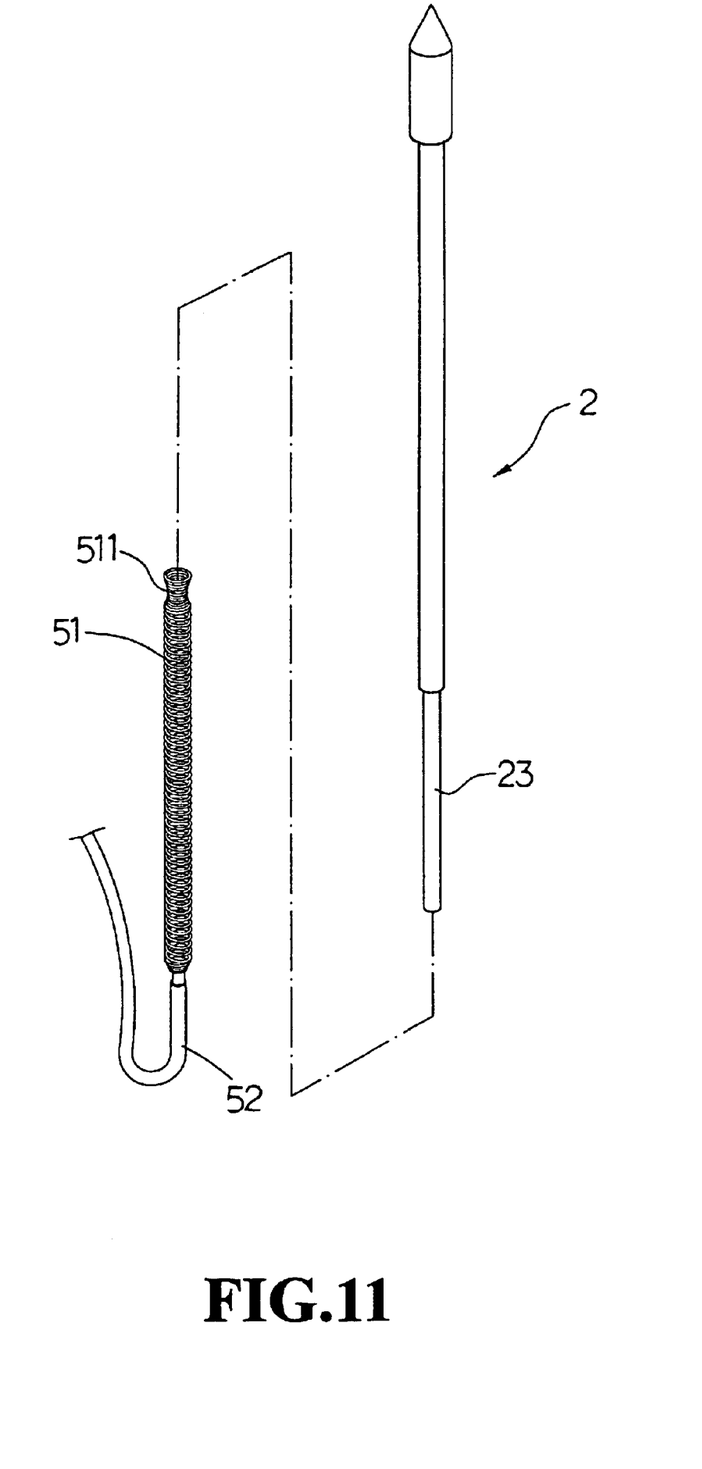
FIG. 11 is an exploded drawing of yet another configuration of the probe, the spring, and the wire of the invention herein.
Figure 12:
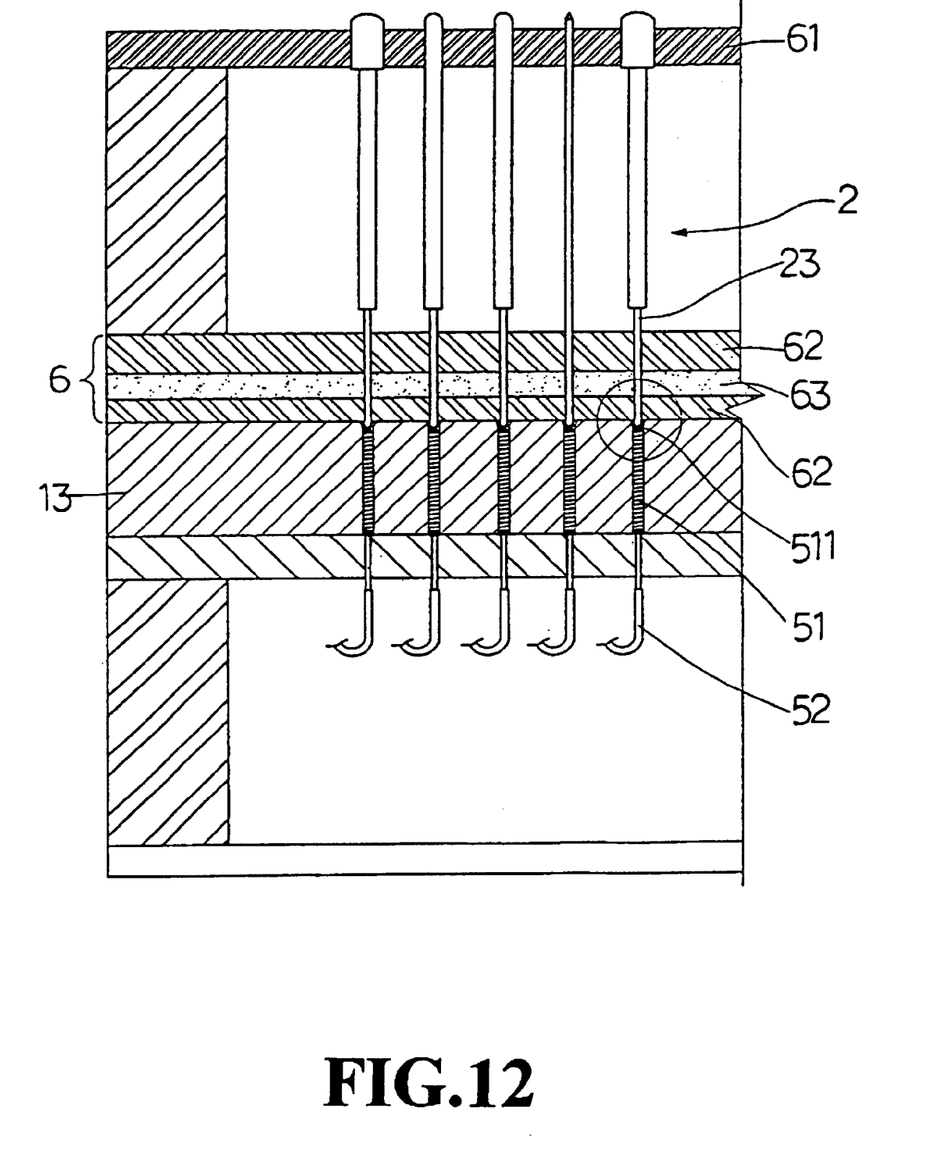
FIG. 12 is a cross-sectional drawing of FIG. 11.
Figure 13:
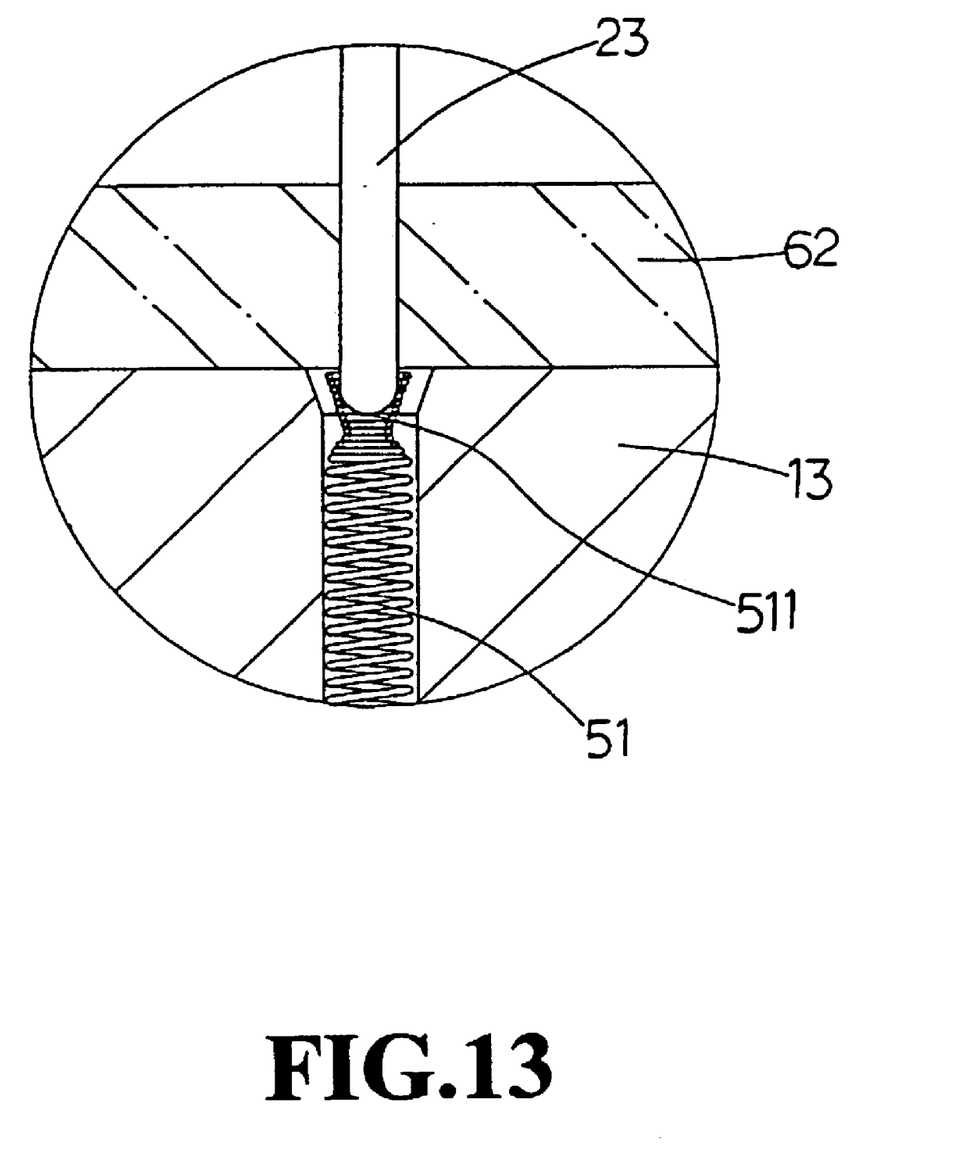
FIG. 13 is a partial magnified, cross-sectional drawing of the probe and the spring of the invention herein.

Referring to FIG. 11, FIG. 12, and FIG. 13, in the invention herein, the spring 51 has formed at its top portion a retaining section 511, a wedge-shaped receptacle (or conically shaped receptacle), the bottom aspect of which gradually recedes to a diameter smaller than that of the probe 2 insert section 23, enabling it to be snug fitted onto and brought into electrical continuity with the bottom end of the probe 2 insert section 23 to thereby function as a substitute for the said upper block 50 at the top portion of the spring 51.

What is claimed is:

1. An improved structure composite-type test fixture consisting of a base, a probe board, as well as a plurality of probes and probe barrels, wherein the said probe board is situated on the upper extent of the said base and has a plurality of holes drilled in its upper surface that are aligned at the bottom surface with the connection points of a circuit board unit under test, with the holes of the said probe board providing for the entry of the said probe barrels and the said probes utilized to examine the various connection points of the said circuit board unit under test, the features of which are: a stack planar is postured flush against the upper surface of the said probe board, the said stack planar having plurality of drilled through-holes that are aligned with the said probe board holes; the said plurality of probes are each respectively inserted into the through-holes of the said stack planar, of which the tips are in a range of different diameters and size specifications, the top extremities protrude from the upper surface of the said stack planar, and the distal extremities consist of a single specification insert section that fit into the said probe barrels; each said probe barrel has an internally disposed spring, the said spring consisting of an upper block at the leading end and a wire connected to the trailing end such that after the said probe barrel is sleeved over the exterior of the said spring, the said trailing end is clipped to it and, furthermore, a copper pin terminates the trailing end of the said wire from the said probe barrel, thereby enabling the direct insertion of the said copper pin into the flat cable of a circuit tester.

2. As mentioned in claim 1 of the improved structure composite-type test fixture invention herein, the said stack planar consists of a top board at its uppermost surface, with the through-holes in the said top board disposed at the same diameter and dimensions as the tip extremities of the said probes; two thickness boards placed along the bottom portion of the said stack planar, the through-holes of the said thickness boards disposed at the same specification as the said insert sections constituting the distal extremities of the said probes; and one pliant plastic board having no drilled holes sandwiched between the said two thickness boards.

3. As mentioned in claim 1 of the improved structure composite-type test fixture invention herein, the said probe plate is additionally equipped immediately below with a bottom board having minute through-holes drilled in positional correspondence to the holes in the said probe board and sized to accommodate the inserted leading ends of the said wires; furthermore, the said springs are contained in the holes of the said probe board, with the said upper blocks at their top portions in contact with the said probe insert section and the bottom ends connected to the leading ends of the said wires.

4. As mentioned in claim 1 and claim 3 of the improved structure composite-type test fixture invention herein, the said spring has formed at its top portion a retaining section, which can be a wedge-shaped receptacle or conically shaped receptacle, the bottom aspect of which gradually recedes to a diameter smaller than that of the said probe insert section.

* * * * *